United States Patent [19]

Chang et al.

[11] 4,311,925

[45] Jan. 19, 1982

[54] CURRENT SWITCH EMITTER FOLLOWER LATCH HAVING OUTPUT SIGNALS WITH REDUCED NOISE

[75] Inventors: Albert Y. Chang; Punit J. Pandya, both of Poughkeepsie, N.Y.

[73] Assignee: International Business Machines Corporation, Armonk, N.Y.

[21] Appl. No.: 75,921

[22] Filed: Sep. 17, 1979

[51] Int. Cl.³ .................. H03K 21/00; H03K 23/14; H03K 23/08; H03K 23/30

[52] U.S. Cl. ................................. 307/455; 307/289; 307/448; 307/453

[58] Field of Search ............... 307/289, 218, 455, 445, 307/446, 448, 453; 328/196

[56] References Cited

U.S. PATENT DOCUMENTS

| | | | |
|---|---|---|---|
| 3,339,089 | 8/1967 | Bergman | 307/455 |
| 3,458,719 | 7/1969 | Weiss | 307/455 |
| 3,505,535 | 4/1970 | Cavaliere | 307/455 |
| 3,509,366 | 4/1970 | Howe, Jr. et al. | 307/455 |
| 3,610,955 | 10/1971 | Blaser et al. | 307/235 |
| 3,612,911 | 10/1971 | Kross | 307/455 |
| 3,617,772 | 11/1971 | Tertel | 307/247 |
| 3,649,852 | 3/1972 | Bohley | 307/455 |
| 3,725,878 | 4/1973 | Berding | 340/173 FF |
| 3,728,560 | 4/1973 | Treadway | 307/289 |
| 3,740,590 | 6/1973 | Hart et al. | 307/289 |
| 3,986,057 | 10/1976 | Eichelberger | 307/289 |
| 4,099,070 | 7/1978 | Reinert | 307/238 |

OTHER PUBLICATIONS

IBM Technical Disclosure Bulletin, vol. 18 No. 5, Oct. 1975, (High Speed Glitchless Cascade Latch with Set by Blumberg et al.

*Primary Examiner*—Saxfield Chatmon, Jr.
*Attorney, Agent, or Firm*—Wesley DeBruin

[57] ABSTRACT

An improved current switch emitter follower (CSEF) latch has reduced "noise" in the output signal from equal and opposite operation of the output transistors. The improvement resides in dotting the collector resistors of the input transistors in each current switch with a common shift resistor. The dotted collector resistors control the output transistors whereby one turns on and the other turns off with little change in output signal level as clock signals change to the input transistor.

10 Claims, 5 Drawing Figures

CURRENT SWITCH EMITTER FOLLOWER LATCH HAVING OUTPUT SIGNALS WITH REDUCED NOISE

DESCRIPTION

1. Technical Field

This invention relates to latch circuits. More particularly, the invention relates to current switch emitter follower (CSEF) latch circuits with dotted emitter output circuits.

One object of the invention is a latch that has reduced "noise" in the output during turn on and turn off.

Another object is a current switch emitter follower latch that is internally compensated to reduce "noise" during turn on and turn off by clock signals.

Still another object is a currrent switch emitter follower latch with dotted emitter output that has reduced "noise" in the output without added delay or false output signals.

2. Background Art

CSEF latches develop "noise" when the emitter followers are dotted together. The "noise" appears as rapid signal variations or "glitches" in the output level. The "noise" occurs at both the leading and trailing edges of the output signal. The source of the "noise" is the asymmetrical operation of the dotted emitter followers, one of which is caused to turn "on" and the other which is caused to turn "off", as the clock signals change to the input transistors of the respective current switches. The difference in turn on and turn off produces a sudden change in the output signal level or "glitch". One way to control "noise" in the output signals of such latches is to alter the clock signals so that one emitter follower is turned on fully before the other emitter follower is turned off. This technique delays the processing of data which is undesirable in high speed data processing. Another technique is to add additional elements to the latch to compensate for the "noise" introduced in the output signal. Without compensation for the "noise", false signals will be introduced in successive latch stages which will create erroneous data in the information being processed.

The present invention overcomes the "noise" problem by internal compensation of the dotted emitters so that one emitter follower is delayed in turning off while the other is accelerated in turning on so that the output signal level remains substantially constant. The internal compensation of the dotted emitters is achieved by dotting the collector resistors of the input transistors in each current switch. The dotted collector resistors to the common shift resistor are coupled to the input of each emitter follower. Both emitter followers, therefore, are turned on to the same extent because they have the same voltage level at the base when the active transistor is on. With the input levels to the emitter followers being the same, the clocks will turn on and turn off the transistors in a similar manner. The clocks can be controlled so that one emitter follower will be turned on hard while the other emitter follower is slowly turned off. The result is that the output signal level is substantially constant and "noise" is eliminated.

BRIEF DESCRIPTION OF THE DRAWINGS

In the accompanying drawings forming a material part of this disclosure.

DISCLOSURE OF INVENTION

Figure 1:
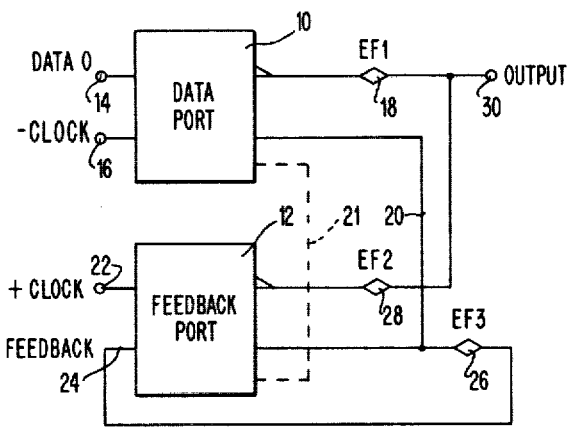
FIG. 1 is a block logic diagram showing the logic elements and connections of a latch.

In FIG. 1, a current switch emitter follower latch includes a first current switch 10 and a second current switch 12 defined as the data port and feedback port, respectively. The circuit 10 receives a data signal 14 as a first input which can vary between a positive or up level voltage, defined as a binary "1" and a ground or down level voltage, defined as a binary "0". Circuit 10 also receives a negative clock signal 16 as a second input. The negative clock varies between a plus voltage level and a negative voltage level, the active part of the clock being at the negative level. An output signal from the circuit 10 appears at an emitter follower 18. The circuit 10 is coupled by a connection 20 to the circuit 12. The details of the connection 20 will be described hereinafter. A dotted connection 21 also exists between circuits 10 and 12, and forms a part of the invention, as will be described hereinafter.

A positive clock 22 is provided as a first input to the circuit 12. The positive clock varies between a negative voltage level and a positive voltage level, the active part of the clock being at the positive level. A second input to the circuit 12 is provided from a feedback loop 24, coupled to the connection 20 through an emitter follower 26. An output is provided from the circuit 12 by way of an emitter follower 28 that is coupled to the emitter follower 18. A common output 30 is taken from the dotted emitter followers 18 and 28.

Figure 2:
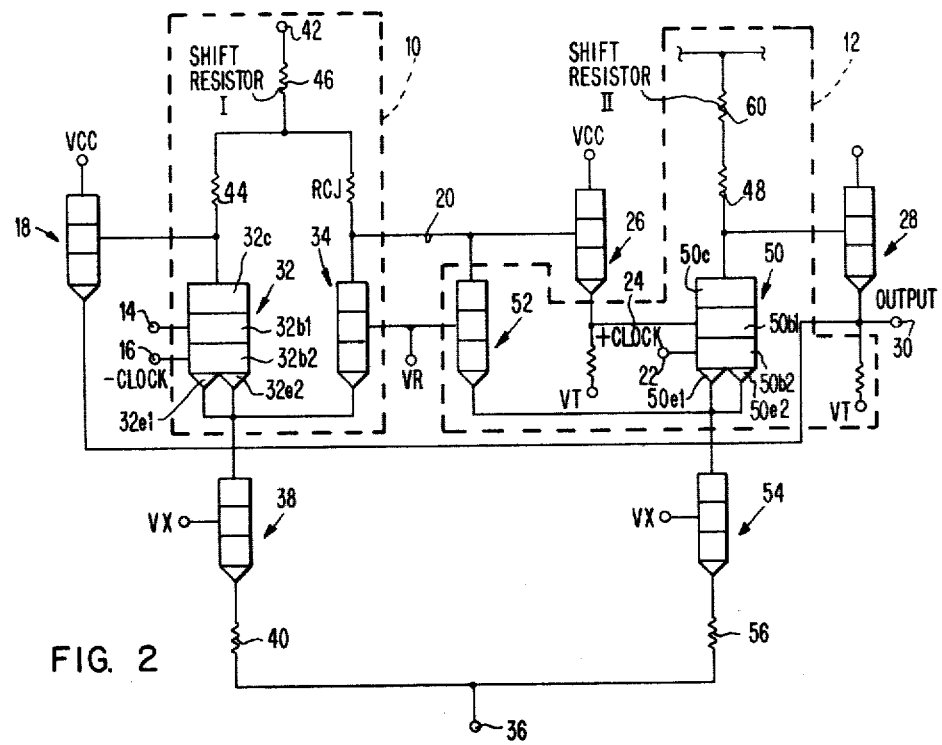
FIG. 2 is an electrical schematic of a conventional current switch emitter follower latch with dotted emitter output.

FIG. 2 shows one version of the latch shown in FIG. 1. This circuit has the problem that a signal appearing at the output 30 has "noise" when a binary "0" is present at the data terminal; the feedback loop is in a binary "0" condition and both the positive and negative clock signals are present. The turn on of the emitter follower 18 and the turn off of the emitter follower 28 are not equal and opposite resulting in "noise", as will be explained hereafter. For other data and feedback conditions e.g. data equal "0"/feedback equal "1" or data equal "1"/feedback equal "1" or "0", there is no "noise" problem. When data and feedback both are "1", both emitter followers turn on equally. When the data and feedback are of opposite polarity, the output is changing state and there is no noise.

The current switch 10, described in FIG. 1, includes a multi-emitter transistor 32 with emitters $32e1$, $32e2$ and bases $32b1$, $32b2$. The transistor 32 provides an invert output at collector $32c$. A single emitter transistor 34 is included in the current switch 10 and provides an non-invert output. Multi-emitter transistors of the type employed here are described in *Digital Integrated Electronics*, page 199, M. Taub and D. Schilling, published by McGraw Hill, 1977.

The transistor 32 receives the data input 14 and negative clock input 16 at the bases 32b1 and 32b2, respectively. The transistor 34 is connected to a reference voltage $V_R$ at its base electrode. The transistors 32 and 34 are coupled together at their emitters and further coupled to a power sink 36 through a transistor 38 and resistor 40. The transistor 32 is connected to a power supply 42 ($V_{cc}$) through a load resistor 44 and a shift resistor 46. The purpose of the shift resistor is to provide a symmetrical output swing. That is to say, the output voltage levels will be symmetrical with respect to the reference or ground level. The emitter follower 18 is coupled to the collector of the transistor 32. The collector of the transistor 34 is coupled to the power supply 42 through a load resistor 48 and the shift resistor 46. An emitter follower 26 is coupled to the collector of the transistor 34.

The current switch 12, described in FIG. 1 includes a multi-emitter transistor 50 with emitters 50e1, 50e2 and base 50b1, 50b2. The transistor provides an invert output at collector 50c. A single emitter transistor 52 is included in the current switch 12 and provides a non-invert output. The transistors 50 and 52 are coupled together at their emitters and further coupled to the power sink 36 through a transistor 54 and a resistor 56. The transistor 52 provides a feedback signal to the transistor 50 from the collector of the former to the base of the latter by way of the emitter follower 26 and the feedback connection 24. The non-invert transistor 52 is also coupled to the non-invert transistor 34 through the common connection 20, and is also connected to the reference voltage $V_R$ through its base electrode.

The transistor 50 receives the positive clock signal 22 as well as the feedback signal by way of the connection 24. The collector of the transistor 50 is connected to the power supply 42 by way of a load resistor 58 and a shift resistor 60. The base electrode of emitter follower 28 is connected to the collector of the transistor 50 and further coupled at its emitter to the emitter follower 18. An output signal is provided at the common output terminal 30 for the emitter followers 18 and 28.

Figure 3:
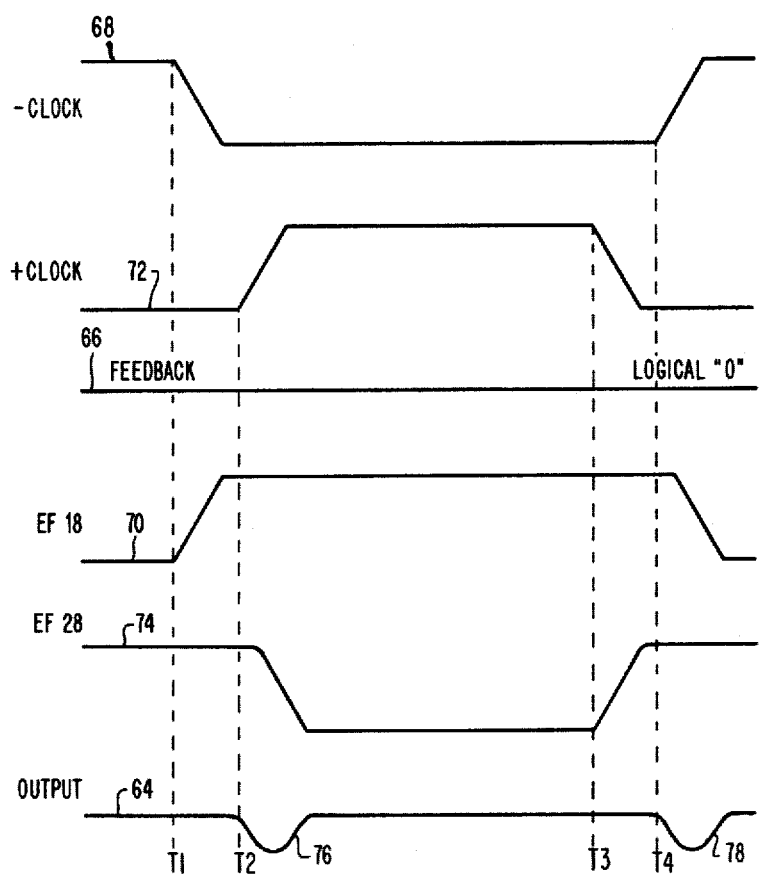
FIG. 3 shows waveforms of data, positive and negative clock signals on an emitter follower, and output signals for FIG. 2, at a first data and feedback condition.

A problem is presented in FIG. 2 when a data level 62 and a feedback level 66 are both at a down or binary "0" condition, as shown in FIG. 3 at time $T_1$. An output level 64 at $T_1$ for this condition is an up level as shown in FIG. 3. The feedback loop is at the down level 66, because the previous data input signal (not shown) was also a binary "0" or down level. When a negative clock signal 68 appears at terminal 16 in FIG. 2, the transistor 32 is turned off and the emitter follower 18 begins to turn on harder and provides an output 70, as shown in FIG. 3, as the voltage increases at the base of the emitter follower 18. Transistor 50 begins to turn on as the positive clock appears at terminal 22 and the emitter follower 28 begins to turn off at $T_2$ and provides an output 74, as shown in FIG. 3, due to the lowering of the base voltage at the emitter follower 28. The turn on of the emitter follower 18 and the turn off of the emitter follower 28 are such that the former is not fully on while the latter has reduced its output level. The result is an output signal variation 76 which appears in the output 64, as shown in FIG. 3, after $T_2$. Essentially, the variation or "noise" or "glitch" is proportional to the sum of the clock signals 68 and 72 after $T_2$. At time $T_2$, the circuit is stabilized with the output level 64 being constant at the "1" level for the data signal 62 being at "0", and the feedback signal 66 also being at "0".

At time $T_3$, the positive clock (waveform 72) is removed. Therefore, at time $T_4$ when the negative clock (waveform 68) is restored, a signal variation 78 ("noise") appears in the output 64 as shown in FIG. 3. Again, the "noise" is due to the slowness in turn on of the emitter follower 28 (waveform 74) and the decrease in the output of the emitter follower 18 (waveform 70), as shown in FIG. 3.

Figure 4:
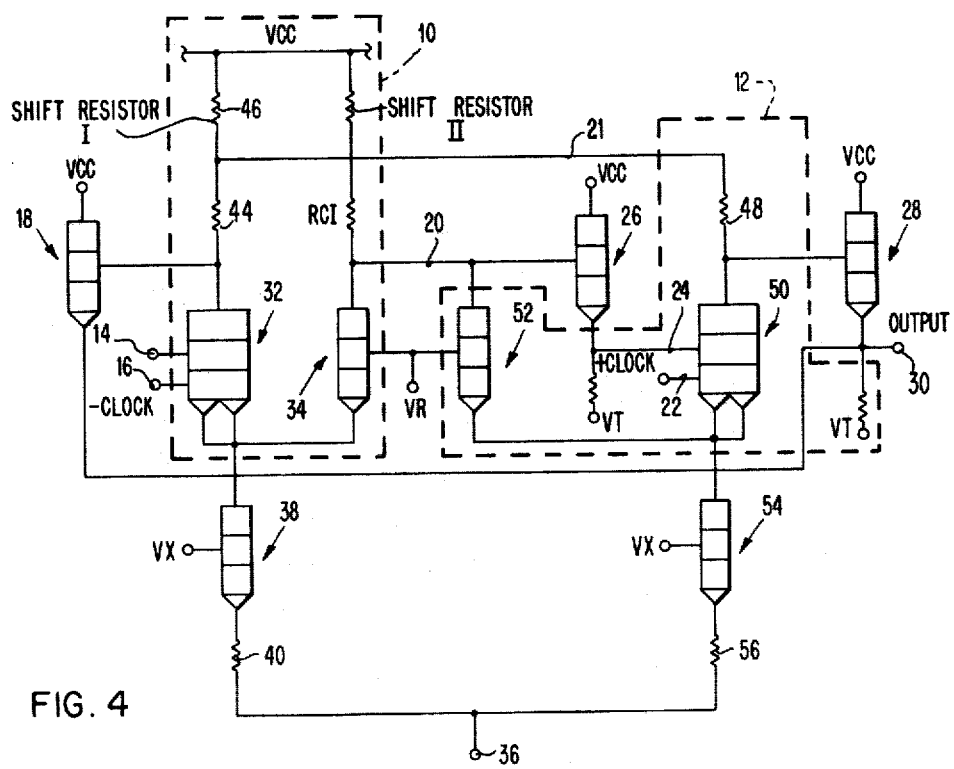
FIG. 4 is an electrical schematic of a current switch emitter follower latch with dotted emitters that incorporates the principles of the present invention.

The circuit shown in FIG. 4 corrects the problem associated with the circuit of FIG. 2. The elements of FIG. 4 have the same reference numerals as those in FIG. 2. The difference between the circuits of FIG. 2 and FIG. 4 resides in the connection 21 further coupling the circuits 10 and 12, as shown in FIG. 1. The connection 21 couples the shift resistor 46 to the load resistors 44 and 48 of the transistors 32 and 50, respectively, as shown in FIG. 4. Previously, the transistors 32 and 50 were coupled to their individual resistors 46 and 60, respectively. The connection 21 permits the emitter follower 18 to be turned on harder while the turn off of emitter follower 28 is delayed when the positive and negative clock signals appear. The connection 21 also permits the emitter follower 28 to be turned on hard before the emitter follower 18 is turned off when the positive and negative clocks are removed.

Figure 5:
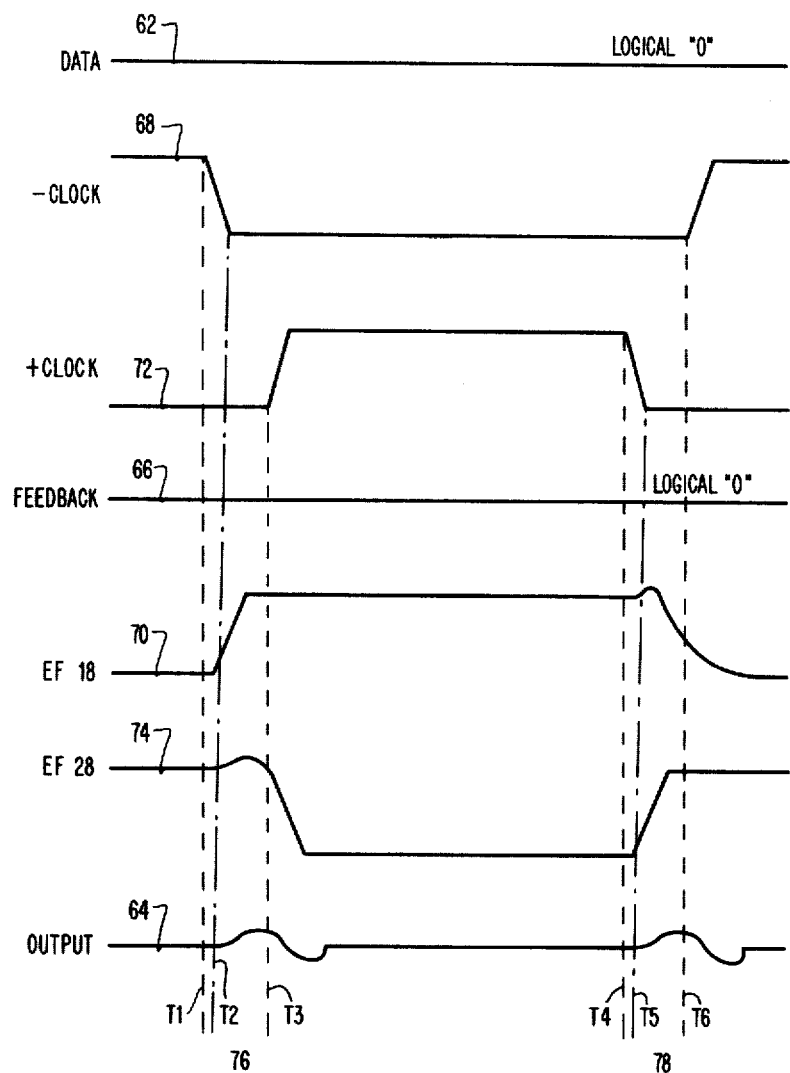
FIG. 5 shows waveforms of data, positive and negative clock signals and emitter followers, and output signals for FIG. 4, at the first data and feedback condition.

In FIG. 5, the data signal 62 does not change during the period $T_1$ to $T_6$. The negative clock signal 68 commences to appear at $T_1$ and is fully present at $T_2$. The positive clock signal 72 is slightly delayed beyond $T_2$ to $T_3$ before turn off begins on emitter follower 28, as shown in FIG. 5. The transistors 32 and 50 are both off during $T_2$-$T_3$. In this period of transition, no current flows through the shift resistor 46. The voltage at the base of the emitter follower 18 rises towards $V_{cc}$ from the down level condition area at $T_1$. The output at the emitter follower 18, as shown in FIG. 5, rapidly rises towards the up level. The emitter follower 28 which had been in the on condition prior to the time $T_1$, is delayed in turn off by the positive clock signal 72. The emitter follower output 74 increases slightly due to the base voltage rising closer to $V_{CC}$ then falls off slower than the output rises at the emitter follower 18, as shown in FIG. 5. The output 64 during the time $T_2$ and $T_3$ at the terminal 30 has a signal variation 76 with a slight increase then a decrease $T_3$, as shown in FIG. 5. The increase and decrease in 76 is due to the common base voltage to the emitter followers 18 and 28 and the rapid turnoff of the emitter follower 28 when the positive clock appears at the transistor 50. Similarly, between $T_4$ and $T_5$, the emitter follower 28 is turned on fast while the emitter follower 18 is slowly turned off, as shown in FIG. 5. Again, the output 64 between times $T_5$ and $T_6$ has a signal variation 78 that increases slightly and then decreases after $T_6$ for the reason described in connection with $T_2$ and $T_3$.

The results of the connection 21, therefore, is to internally compensate the turn on and turn off of the transistors 18 and 28 to achieve a substantially constant output for the condition when a data "0" is present at the terminal 14 and the feedback loop 24 is in a down or "0" condition. The connection 21 causes a shutting off the current to the shift resistor 46 which is shared by the transistors 32 and 50 for the data and feedback levels, respectively, and permits the emitter follower 18 or 28 turning on to reach the up level before the emitter follower 28 or 18, respectively, turning off has reduced the output level. In net, the connection 21 permits a common input voltage to be provided to the emitter followers 18 and 28, with the results that their common output is less impacted by the rising and falling of the positive and negative clocks, respectively.

It is to be understood that the present invention is not limited to the precise construction and details described herein and the inventors reserve all changes and modifications coming within the scope of the invention as defined in the appended claims.

Having thus described my invention, what I claim as new, and desire to secure by Letters Patent is:

1. An improved current switch emitter follower latch comprising:
   (a) A first current switch including first and second circuits and having an output through a first emitter follower,
   (b) a second current switch including first and second circuits and having an output through a second emitter follower,
   (c) an output circuit connected to outputs of the first and second emitter followers,
   (d) means coupling the first circuits of the first and second current switches to each other,
   (e) a feedback loop coupling an output of the first circuit as an input to the second circuit of the second current switch, and
   (f) means providing a common input voltage to the first and second emitter followers whereby noise is substantially eliminated in the output circuit when a data input signal is at a down or binary "0" level to the first current switch and the feedback loop is in a down or binary "0" condition and positive and negative signals are successively provided as inputs to the first and second current switches, respectively.

2. The current switch emitter follower latch described in claim 1 further including an emitter follower included in the feedback loop for receiving the input from the first circuit and providing an output to the second circuit of the second current switch.

3. The current switch emitter follower latch described in claim 1 wherein the means providing a common input voltage to the first and second emitter followers comprises first and second resistive connections between the base terminals of the first and second emitter followers to a supply voltage through a common shift resistor.

4. The current switch emitter follower latch described in claim 3 wherein the means coupling the first circuits of the first and second current switches is further connected to the emitter follower included in the feedback loop.

5. The current switch emitter follower latch described in claim 1 wherein the first circuit in the first and second current switches includes a multi-emitter, multi-base and single collector transistor.

6. The current switch emitter follower latch described in claim 5 wherein a data signal and a clock signal are provided as separate inputs to different base regions of one first transistor and a feedback signal and a clock signal are provided as different inputs to the bases of the other first transistor.

7. The current switch emitter follower latch described in claim 6 wherein the supply voltage is connected through a shift resistor as an input to the first and second emitter followers and to the collectors of the multi-emitter, multi-base transistors.

8. The current switch emitter follower latch described in claim 7 wherein the output signal at the first and second emitter followers will be substantially constant when a binary "0" condition is present for both a data signal and a feedback signal and a positive clock signal begins after and ends before a negative clock signal.

9. An improved current switch emitter follower latch comprising:
   a first current switch circuit means including a first transistor and a second transistor, said first transistor having a collector, a first base, a second base and an emitter, said second transistor having a collector, a base and an emitter, first and second resistors serially connecting said collector of said first transistor to a first potential source, a third resistor serially connecting said collector of said second transistor to said first potential source;
   a second current switch circuit means including a third transistor and a fourth transistor, said third transistor having a collector, a first base, a second base and an emitter, said fourth transistor having a collector, a base and an emitter, a fourth resistor serially connecting said collector of said third transistor to the juncture of said first and second resistors,
   feedback circuit means including a fifth transistor, said fifth transistor having a collector, a base and an emitter, a direct connection between said collector of said fifth transistor and said first potential source, a fifth resistor connecting said emitter of said fifth transistor to a second potential source, a common connection between said collector of said second transistor, said collector of said fourth transistor and said base of said fifth transistor, a direct connection between said emitter of said fifth transistor and said first base of said third transistor;
   a direct connection between said base of said second transistor, said base of said fourth transistor and a source of reference potential;
   a first constant current source connected to said emitter of said first transistor and said emitter of said second transistor;
   a second constant current source connected to said emitter of said fourth transistor and said emitter of said third transistor;
   output circuit means including a sixth transistor and a seventh transistor, said sixth transistor having a collector, a base and an emitter, said seventh transistor having a collector, a base and an emitter, a sixth resistor connecting said emitter of sixth transistor and said emitter of said seventh transistor to said second source of potential, a direct connection between said collector of said sixth transistor, said collector of said seventh transistor and said first potential source;
   a source of —clock pulses connected to said second base of said first transistor;
   a source of +clock pulses connected to said second base of said third transistor;
   an input terminal for said current switch emitter follower latch connected to said first base of said first transistor;
   and
   an output terminal for said current switch emitter follower latch connected in common to said emitter of said sixth transistor and said emitter of said seventh transistor.

10. An improved current switch emitter follower latch, as described in claim 9, wherein:

said first constant current source includes an eighth transistor having a collector, a base and an emitter, said collector of said eighth transistor being directly connected to said emitter of said first transistor and said emitter of said second transistor, said base of said eighth transistor being connected to a third potential source, and said emitter of said eighth transistor being connected via a seventh resistor to a fourth potential source; and, said second constant current source includes a ninth transistor having a collector, a base and an emitter, said collector of said ninth transistor being directly connected to said emitter of said third transistor and said emitter of said fourth transistor, said base of said ninth transistor being connected to said third potential source, and said emitter of said ninth transistor being connected via an eighth resistor to said fourth potential source.

* * * * *